United States Patent
Fujioka et al.

(10) Patent No.: US 11,742,267 B2
(45) Date of Patent: Aug. 29, 2023

(54) POWER ELECTRONICS ASSEMBLY HAVING FLIPPED CHIP TRANSISTORS

(71) Applicant: Toyota Motor Engineering and Manufacturing North America, Inc., Plano, TX (US)

(72) Inventors: Hitoshi Fujioka, Ann Arbor, MI (US); Shailesh N. Joshi, Ann Arbor, MI (US); Feng Zhou, Ann Arbor, MI (US); Danny J. Lohan, Ann Arbor, MI (US)

(73) Assignee: Toyota Motor Engineering and Manufacturing North America, Inc., Plano, TX (US)

(*) Notice: Subject to any disclaimer, the term of this patent is extended or adjusted under 35 U.S.C. 154(b) by 487 days.

(21) Appl. No.: 17/068,070

(22) Filed: Oct. 12, 2020

(65) Prior Publication Data

US 2022/0115305 A1    Apr. 14, 2022

(51) Int. Cl.
*H01L 23/495* (2006.01)
*H01L 25/07* (2006.01)

(52) U.S. Cl.
CPC .. *H01L 23/49568* (2013.01); *H01L 23/49537* (2013.01); *H01L 23/49541* (2013.01); *H01L 23/49548* (2013.01); *H01L 23/49562* (2013.01); *H01L 23/49575* (2013.01); *H01L 23/49589* (2013.01); *H01L 25/072* (2013.01)

(58) Field of Classification Search
CPC ............. H01L 25/072; H01L 23/49548; H01L 23/49568; H01L 23/49562; H01L 23/49589; H01L 23/49575; H01L 23/49537; H01L 23/49541
See application file for complete search history.

(56) References Cited

U.S. PATENT DOCUMENTS

| | | |
|---|---|---|
| 5,261,593 A | 11/1993 | Casson et al. |
| 6,545,364 B2 | 4/2003 | Sakamoto et al. |
| 7,211,868 B2 | 5/2007 | Sakamoto et al. |
| 8,546,925 B2 | 10/2013 | Herbsommer et al. |

(Continued)

OTHER PUBLICATIONS automotiveworld.com, "Miniature Power Supply: Infineon Starts First Flip-Chip Production Specifically Designed For Automotive Applications," <automotiveworld.com/news-releases/miniature-power-supply-infineon-starts-first-flip-chip-production-specifically-designed-for-automotive-applications/>, Jan. 23, 2020, 2 pages.

(Continued)

*Primary Examiner* — Alonzo Chambliss
(74) *Attorney, Agent, or Firm* — Jordan IP Law, LLC

(57) ABSTRACT

Methods, apparatuses and systems provide for technology that includes a transistor assembly for a power electronics apparatus having a plurality of transistor pairs arranged in a common plane, where for each pair of transistors one transistor is flipped relative to the other transistor. The technology further includes a first lead frame arranged parallel to and electrically coupled to the first transistor in each transistor pair, a second lead frame coplanar to the first lead frame and arranged parallel to and electrically coupled to the second transistor in each transistor pair, and a plurality of output lead frames arranged coplanar to each other, where each respective output lead frame is arranged parallel to and electrically coupled to a respective one pair of the plurality of transistor pairs.

20 Claims, 5 Drawing Sheets

Cross-sectional view B-B

(56) References Cited

U.S. PATENT DOCUMENTS

| | | | | |
|---|---|---|---|---|
| 9,171,828 B2* | 10/2015 | Lopez | ................... | H01L 24/92 |
| 9,508,633 B2 | 11/2016 | Herbsommer et al. | | |
| 9,779,967 B2 | 10/2017 | Herbsommer et al. | | |
| 2013/0069213 A1* | 3/2013 | Sohn | ................ | H01L 23/49537 |
| | | | | 257/668 |
| 2014/0159216 A1* | 6/2014 | Ishino | ................ | H01L 23/3114 |
| | | | | 438/122 |
| 2017/0236754 A1* | 8/2017 | Shibuya | ................ | H01L 21/78 |
| | | | | 438/112 |

OTHER PUBLICATIONS

S. Jaffe, "Optimizing Flip-Chip IC Thermal Performance In Automotive Designs," Texas Instruments, Power Electronics online article, <powerelectronics.com/markets/automotive/article/21120371/optimizing-flipchip-ic-thermal-performance-in-automotive-designs>, Jan. 13, 2020, 8 pages.

K. Yamaguchi, "Design and Evaluation of SiC-based High Power Density Inverter, 70kW/liter, 50kW/kg," 2016 IEEE Applied Power Electronics Conference and Exposition (APEC), <https://ieeexplore.ieee.org/document/7468302>, pp. 3075-3079.

* cited by examiner

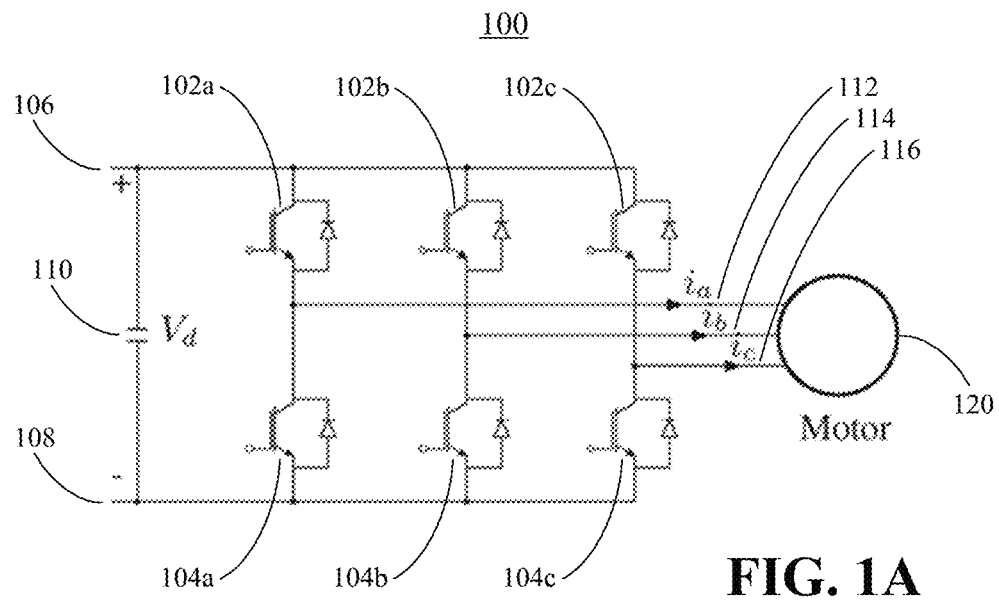
FIG. 1A
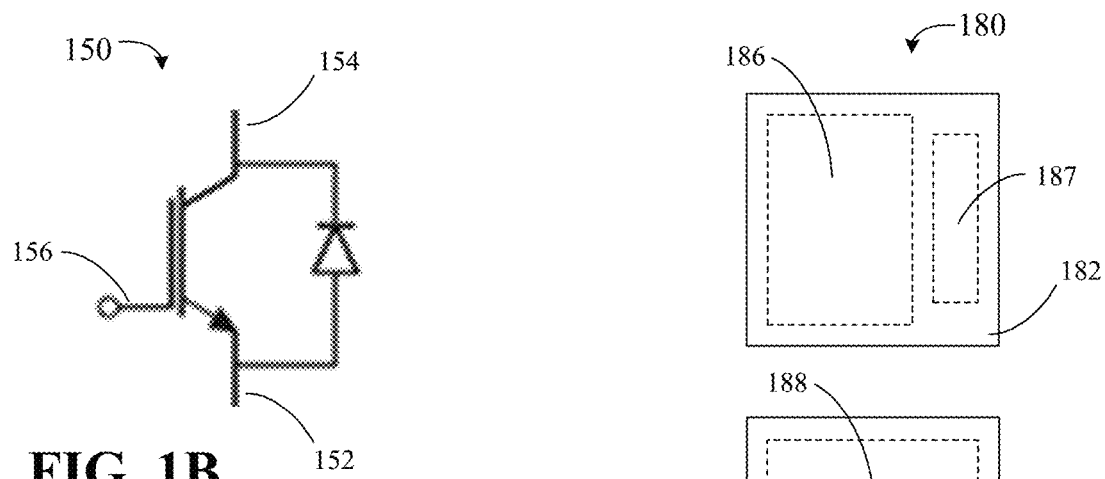
FIG. 1B
FIG. 1C
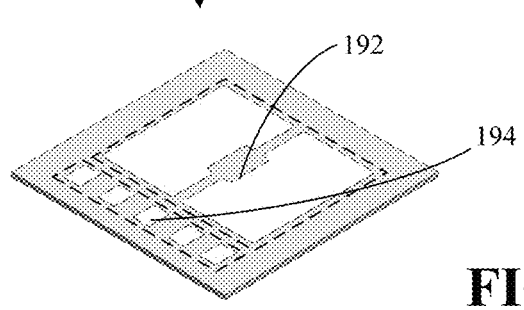
FIG. 1D

Top view (without external resin layers)

Cross-sectional view B-B

Cross-sectional view

Side view

Side view

700

710 — Arrange a plurality of transistor pairs in a common plane, wherein for each pair of transistors the second transistor is flipped relative to the first transistor such that the second surface of the second transistor faces the same direction as the first surface of the first transistor 720 — Arrange a first lead frame parallel to the first transistor in each transistor pair, the first lead frame electrically coupled to the first transistor in each transistor pair 730 — Arrange a second lead frame coplanar to the first lead frame and parallel to the second transistor in each transistor pair, the second lead frame electrically coupled to the second transistor in each transistor pair 740 — Arrange a plurality of output lead frames coplanar to each other, each respective output lead frame arranged parallel to and electrically coupled to a respective one pair of the plurality of transistor pairs

FIG. 7A

760 — Arrange a gate driver circuit parallel to the transistor assembly and electrically coupled to the signal terminal of at least one of the transistors 770 — Arrange a capacitor parallel to the transistor assembly and on an opposite side of the transistor assembly relative to the gate driver circuit 780 — Arrange a first cooling assembly parallel to the transistor assembly and situated between the transistor assembly and the gate driver circuit, and a second cooling assembly parallel to the transistor assembly and situated between the transistor assembly and the capacitor

FIG. 7B

POWER ELECTRONICS ASSEMBLY HAVING FLIPPED CHIP TRANSISTORS

TECHNICAL FIELD

Embodiments generally relate to power electronics assemblies having a reduced size. More particularly, embodiments relate to a compact power electronics assembly with flipped chip transistors.

BACKGROUND

Semiconductor packages may include numerous electrical components such as one or more power electronic devices such as, e.g., metal oxide semiconductor field effect transistor (MOSFET), silicon carbide insulated-gate bipolar transistor, or other switching device, as well as gate drive devices and capacitors. Such semiconductor packages may be used in a variety of contexts, such as the transportation industry (e.g., automotive applications). In the semiconductor packages, the power electronic devices are typically separate from the gate drive devices and capacitors. The relative placement of the power electronic devices, the gate drive devices and capacitors may have impactful effects on performance (e.g., cause parasitic inductance) and size.

BRIEF SUMMARY

In some embodiments, a power electronics apparatus may include a transistor assembly including a plurality of transistor pairs arranged in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor, wherein, the transistor assembly further includes a first lead frame arranged parallel to the first transistor in each transistor pair, the first lead frame electrically coupled to the first transistor in each transistor pair, a second lead frame arranged coplanar to the first lead frame and parallel to the second transistor in each transistor pair, the second lead frame electrically coupled to the second transistor in each transistor pair, and a plurality of output lead frames arranged coplanar to each other, each respective output lead frame arranged parallel to and electrically coupled to a respective one pair of the plurality of transistor pairs.

In some embodiments, a method of constructing a power electronics apparatus may include constructing a transistor assembly including arranging a plurality of transistor pairs in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor, arranging a first lead frame parallel to the first transistor in each transistor pair, the first lead frame electrically coupled to the first transistor in each transistor pair, arranging a second lead frame coplanar to the first lead frame and parallel to the second transistor in each transistor pair, the second lead frame electrically coupled to the second transistor in each transistor pair, and arranging a plurality of output lead frames coplanar to each other, each respective output lead frame arranged parallel to and electrically coupled to a respective one pair of the plurality of transistor pairs.

In some embodiments, a power electronics apparatus may include a plurality of transistor assemblies arranged in a stack, each transistor assembly parallel to the other transistor assemblies in the stack, wherein each transistor assembly includes a plurality of transistor pairs arranged in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor, a first lead frame arranged parallel to the first transistor in each transistor pair, the first lead frame electrically coupled to the first transistor in each transistor pair, a second lead frame arranged coplanar to the first lead frame and parallel to the second transistor in each transistor pair, the second lead frame electrically coupled to the second transistor in each transistor pair, and a plurality of output lead frames arranged coplanar to each other, each respective output lead frame arranged parallel to and electrically coupled to a respective one pair of the plurality of transistor pairs.

BRIEF DESCRIPTION OF THE SEVERAL VIEWS OF THE DRAWINGS

The various advantages of the embodiments of the present disclosure will become apparent to one skilled in the art by reading the following specification and appended claims, and by referencing the following drawings, in which:

FIGS. 1A-1B are diagrams illustrating an example of an inverter circuit for use in one or more embodiments;

FIG. 1C is a diagram illustrating aspects of an example of a transistor chip package for use in one or more embodiments;

FIG. 1D is an illustration of an example of a MOSFET transistor chip package for use in one or more embodiments;

FIGS. 7A-7B provide flowcharts illustrating a method of constructing a power electronics assembly according to one or more embodiments.

DETAILED DESCRIPTION

Figure 2A:
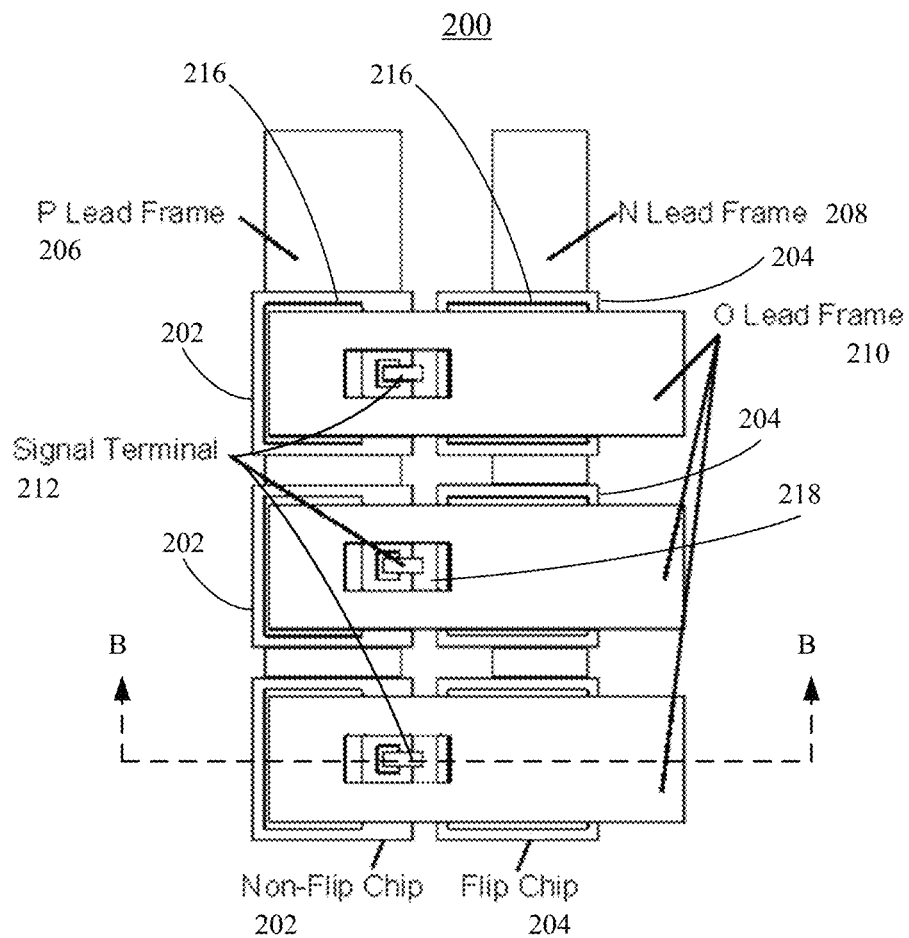
FIGS. 2A-2B are diagrams illustrating an example of a power transistor assembly according to one or more embodiments.

FIG. 1A presents a diagram illustrating an example of an inverter circuit 100 that may be used in one or more embodiments to provide power to a device such as a motor. The inverter circuit 100 may include a plurality of transistor pairs, such as a first pair of transistors 102a and 104a, a second pair of transistors 102b and 104b, and a third pair of transistors 102c and 104c. Each of the transistors may typically be a power switching device and may be of a common type as the others shown in the circuit 100 (e.g., all MOSFET transistors, or all insulated-gate bipolar transistors). The transistor pairs may be arranged such that the two transistors in each transistor pair (such as, e.g., the transistor 102a and the transistor 104a) are connected together in a series fashion as illustrated in FIG. 1A. The transistor pairs may be further arranged as illustrated in FIG. 1A such that a first transistor in each transistor pair is connected to a positive lead 106 (e.g., for connection to a positive lead of a voltage source 110), and a second transistor in each transistor pair is connected to a negative lead 108 (e.g., for connection to a negative lead of the voltage source 110). The voltage source 110 may be a direct current (DC) voltage source, and may be provided by a battery (or battery pack) such as a battery (or battery pack) used in an automobile.

Additionally, as illustrated in FIG. 1A, a first output 112 (illustrated as current $i_a$) may be obtained from the portion of the circuit 100 connecting the transistor 102a and the transistor 104a of the first transistor pair. Similarly, as illustrated in FIG. 1A, a second output 114 (illustrated as current $i_b$) may be obtained from the portion of the circuit 100 connecting the transistor 102b and the transistor 104b of the second transistor pair, and a third output 116 (illustrated as current $i_c$) may be obtained from the portion of the circuit 100 connecting the transistor 102c and the transistor 104c of the third transistor pair. The output currents 112, 114 and 116 may provide, for example, three-phase output currents (e.g., U/V/W) suitable for driving a motor 120. Each of the output currents 112, 114 and 116 may be an alternating current (AC). In some embodiments, the outputs 112, 114 and 116 may be used to drive other devices.

A gate driver circuit (not shown in FIG. 1A) may provide input signals for the signal input (e.g., gate) terminal of each of the transistors in the circuit 100. The gate driver circuit may selectively turn various ones of the transistors in the circuit 100 on or off so as to control the output currents 112, 114 and 116 supplied to the motor 120. One or more capacitors (not shown in FIG. 1A) may be included in the circuit 100 and may be placed, e.g., such that one terminal of each capacitor is connected to the positive lead 106 and the other terminal of each capacitor is connected to the negative lead 108.

FIG. 1B illustrates a transistor 150, which is an expanded view of one of the transistors shown in FIG. 1A. The transistor 150 (which may be, e.g., transistor 102a, transistor 104a, etc.), may include a first terminal 152, a second terminal 154, and a signal terminal 156. In the case where transistor 150 is a MOSFET, the first terminal 152 may be a source terminal, the second terminal 154 may be a drain terminal, and the signal terminal 156 may be a gate terminal. The transistors illustrated in FIGS. 1A and 1B show a diode, but it will be understood that the illustrated diode is typically part of the power switching device and is not provided as an additional device in the circuit 100.

FIG. 1C illustrates aspects of an example of a transistor chip package 180 that may be used in one or more embodiments. The transistor chip package 180 may incorporate one of any of the transistors of the circuit 100 (such as, e.g., transistor 102a, or transistor 102b, etc.). The transistor chip package 180 may typically have a first surface 182 and a second surface 184, and may have a relatively flat form such that the second surface 184 is on an opposite side of the chip package relative to the first surface 182. The first surface 182 may include a first terminal area 186 in which a first terminal (which may be, e.g., a source terminal in the case of a MOSFET) may be located. It will be understood that the dotted lines for area 186 illustrate an approximate area where the first terminal may be located, that the first terminal may occupy all or a portion of area 186, and that the first terminal may include one or more physical areas (e.g., pads) to provide a contact for making an electrical connection to other circuitry and/or to electronic or electromechanical devices.

As illustrated in FIG. 1C, the first surface 182 may also include a signal terminal area 187 in which a signal terminal (which may be, e.g., a gate terminal in the case of a MOSFET) may be located. It will be understood that the dotted lines for area 187 illustrate an approximate area where the signal terminal may be located, that the signal terminal may occupy all or a portion of area 187, and that the signal terminal may include one or more physical areas (e.g., pads) to provide a contact for making an electrical connection to other circuitry and/or to electronic or electromechanical devices. The area 187 may also include one or more additional terminals or pads (not shown), in addition to the signal terminal, to provide contact for current sensing, temperature sensing, etc.

The second surface 184 may include a second terminal area 188 in which a second terminal (which may be, e.g., a drain terminal in the case of a MOSFET) may be located. It will be understood that the dotted lines for area 188 illustrate an approximate area where the second terminal may be located, that the second terminal may occupy all or a portion of area 188, and that the second terminal may include one or more physical areas (e.g., pads) to provide a contact for making an electrical connection to other circuitry and/or to electronic or electromechanical devices. In some cases, the second terminal area 188 may occupy the entire second surface 184.

FIG. 1D is an illustration of an example of a MOSFET transistor chip package 190 for use in one or more embodiments. The MOSFET transistor chip package 190 may correspond to the transistor chip package 180 (FIG. 1C, already discussed). The MOSFET transistor chip package 190 may include a first terminal area 192 (shown within dotted lines) in which a first (i.e., source) terminal may be located. As illustrated, the first terminal area 192 may include a plurality of pads (two pads in the illustration) to provide electrical contact for the source terminal. The first terminal area 192 may correspond to the first terminal area 186 (FIG. 1C, already discussed). The MOSFET transistor package 190 may also include a signal terminal area 194 (shown within dotted lines) in which a signal (i.e., gate) terminal may be located, with at least one pad to provide electrical contact for the gate terminal. As illustrated, the signal terminal area 194 may also include a plurality of other pads comprising contacts for current sensing signals, temperature sensing signals, etc. The signal terminal area 194 may correspond to the signal terminal area 187 (FIG. 1C, already discussed). The first terminal area 192 and the signal terminal area 194 are both located on a first surface (e.g., front side of the device) of the MOSFET transistor package 190. The MOSFET transistor package 190 may also include a second (i.e., drain) terminal area (not shown) on a second surface (not shown) located on an opposite side (e.g., back side of the device) relative to the first surface, to provide electrical contact for the drain terminal. The back side of the device comprising the drain may have no metalized pad, and may be bonded to a substrate, such as a copper substrate.

Figure 2B:
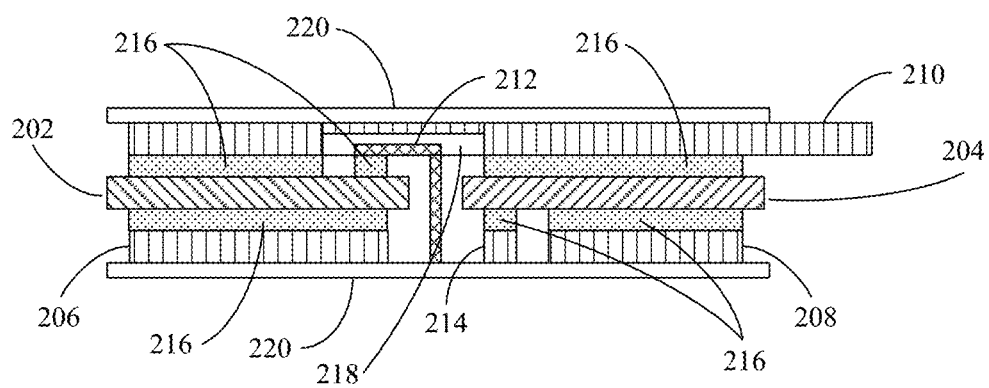

FIGS. 2A and 2B present diagrams illustrating an example of a power transistor assembly 200 according to one or more embodiments, with reference to components and features described herein including but not limited to the figures and associated description. The power transistor assembly 200 may be configured for use in a power electronics assembly (such as described below with reference to FIG. 4 or FIG. 5). FIG. 2A illustrates the power transistor assembly 200 from the perspective of a top view (shown without any external resin layers), while FIG. 2B illustrates a cross-sectional view (B-B) of the power transistor assembly 200. As shown in FIGS. 2A and 2B, the power transistor assembly 200 may include a plurality of pairs of transistors, each transistor pair including a first transistor 202 and a second transistor 204. Three pairs of transistors are shown in FIG. 2A, although the power transistor assembly 200 may include a number of transistor pairs greater than or less than three. Each of the transistors may be a transistor such as illustrated in FIGS. 1B, 1C and 1D. Thus, as illustrated in FIG. 1C and/or FIG. 1D, each transistor may have a first terminal and a signal terminal on a first surface and a second terminal on a second surface, the second surface on an opposite side relative to the first surface.

The arrangement of electronic components in the power transistor assembly 200 may reduce deleterious effects including parasitic inductance, while also reducing the overall size of the assembly 200. For example, the placement of components may permit a reduction in size of the power transistor assembly 200, while also reducing unwanted thermal effects (e.g., high heat concentrations) and unwanted electrical effects (e.g., parasitic induction).

The transistor pairs in the power transistor assembly 200 may be arranged in a common plane. In each pair of transistors, the second transistor 204 is flipped relative to the first transistor 202 such that the second surface of the second transistor 204 faces the same direction as the first surface of the first transistor 202. As illustrated in FIGS. 2A and 2B, the first transistor 202 is shown with the first surface facing up, and the second transistor 204 is shown with the second surface facing up.

The power transistor assembly 200 may include a first lead frame 206 arranged parallel to the first transistor 202 in each transistor pair (specifically, parallel to the first and second surfaces of the first transistor 202). The first lead frame 206 may be constructed from a suitable conducting material (such as, e.g., copper or a copper alloy). The first lead frame is electrically coupled to the first transistor 202 in each transistor pair. In FIG. 2A, the first lead frame 206 is labeled P Lead Frame 206, and may be configured for connection to a positive terminal (or positive lead) for a voltage source, such as voltage source 110 shown in FIG. 1A. For example, the first lead frame 206 may be electrically coupled to the second terminal of each transistor 202 (shown with the second surface facing down). Electric coupling or connection may be accomplished, e.g., through use of electrical solder. A solder area 216 is shown providing electric coupling between the second terminal of the first transistor 202 and the first lead frame 206. (Several solder areas 216 are shown in FIGS. 2A and 2B providing electric coupling or connection in several instances as described herein.) In an embodiment, the first lead frame 206 may include, or may be configured for connection to, a busbar.

The power transistor assembly 200 may further include a second lead frame 208 arranged coplanar to the first lead frame 206 and parallel to the second transistor 204 in each transistor pair (specifically, parallel to the first and second surfaces of the second transistor 204). The second lead frame 208 may be constructed from a suitable conducting material (such as, e.g., copper or a copper alloy). The second lead frame 208 is electrically coupled to the second transistor 204 in each transistor pair. In FIG. 2A, the second lead frame 208 is labeled N Lead Frame 208, and may be configured for connection to a negative terminal (or negative lead) for a voltage source, such as voltage source 110 shown in FIG. 1A. For example, the second lead frame 208 may be electrically coupled to the first terminal of each transistor 204 (shown with the first surface facing down). A solder area 216 is shown providing electric coupling between the first terminal of the second transistor 204 and the second lead frame 208. In an embodiment, the second lead frame 208 may include, or may be configured for connection to, a busbar.

The power transistor assembly 200 may further include a plurality of output lead frames 210 arranged coplanar to each other, where each respective output lead frame 210 is arranged parallel to a respective one pair of the transistor pairs. Each of the output lead frames 210 may be constructed from a suitable conducting material (such as, e.g., copper or a copper alloy). Each respective output lead frame 210 is electrically coupled to the respective one pair of the transistor pairs. In FIG. 2A, the output lead frames 210 are labeled O Lead Frame 210, and may be configured for connection to a power-driven device such as, e.g., motor 120 shown in FIG. 1A. For example, a respective output lead frame 210 may be electrically coupled to the first terminal of the transistor 202 (shown with the first surface facing up) of the respective transistor pair and to the second terminal of the transistor 204 (shown with the second surface facing up) of the respective transistor pair. A solder area 216 is shown providing electric coupling between the first terminal of the respective transistor 202 and the respective output lead frame 210; another solder area 216 is shown providing electric coupling between the second terminal of the second transistor 204 and the respective output lead frame 210. In an embodiment, each of the output lead frames 210 may include, or may be configured for connection to, a busbar.

The power transistor assembly 200 may further be configured to accommodate signal terminal connections 212 for connecting to a signal terminal for each of the non-flipped transistors 202. As shown in FIGS. 2A and 2B, each of the transistors 202 is arranged such that the signal terminal faces upward in the direction toward the respective output lead frame 210. For each transistor 202, a conductor may be placed to provide an electrical coupling or connection 212 to the signal terminal, and may include, e.g., a copper via or other suitable conductor. As shown in FIG. 2B, the copper via or other conductor may be arranged to provide a connection on an opposite side or surface of the transistor assembly 200 relative to the signal terminal of the respective transistor 202. A solder area 216 as shown may provide electric coupling between the signal terminal and the copper via or other conductor for connection to a signal (or gate) driver circuit (not shown). As shown in FIGS. 2A and 2B, to reduce or minimize the physical space occupied by the power transistor assembly 200, each of the output lead frames 210 may include a cutout area 218 surrounding the signal terminal 212. The cutout area 218 may be configured to accommodate the signal terminal 212 by allowing placement of the respective output lead frame 210 closer to the respective transistor pair while avoiding electrical contact between the respective output lead frame and the respective signal terminal 212. The space around the cutout area 218 may be fully or partially filled with a suitable insulating material (such as, e.g., resin). Likewise, other interior spaces or gaps in the power transistor assembly 200 may be fully or partially filled with a suitable insulating material (such as, e.g., resin).

The power transistor assembly 200 may further be configured to accommodate signal terminal connections 214 for each of the flipped transistors 204. As shown in FIGS. 2A and 2B, each of the transistors 204 is arranged such that the signal terminal faces downward in the direction away from the respective output lead frame 210. A conductor may be placed to provide an electrical coupling or connection 214 to the signal terminal, and may include, e.g., a copper via or other suitable conductor. A solder area 216 as shown may provide electric coupling between the signal terminal and the copper via or other conductor for connection to a gate driver circuit (not shown).

As an example, to configure the power transistor assembly 200 to implement the inverter circuit 100 (FIG. 1A) using MOSFET transistors, then the lead frames would be connected as follows. The first lead frame 206 would be connected to the drain terminal of each of three transistors 202 (illustrated as transistors 102a, 102b and 102c in FIG. 1A), and configured for connection to the positive terminal of a voltage source (illustrated as voltage source 110 in FIG. 1A). The second lead frame 208 would be connected to the source terminal of each of three transistors 204 (illustrated as transistors 104a, 104b and 104c in FIG. 1A), and configured for connection to the negative terminal of a voltage source (illustrated as voltage source 110 in FIG. 1A). A first output lead frame 210 would be connected to a first transistor pair, specifically to the source terminal of a transistor 202 of the pair (illustrated as transistor 102a in FIG. 1A) and to the drain terminal of a transistor 204 of the pair (illustrated as transistor 104a in FIG. 1A). The first output lead frame 210 would also configured for connection to a power-driven device (e.g., illustrated as motor 120 in FIG. 1A) to supply current (e.g., illustrated as output 112 (current $i_a$) in FIG. 1A). A second output lead frame 210 would be connected to a second transistor pair, specifically to the source terminal of a transistor 202 of the pair (illustrated as transistor 102b in FIG. 1A) and to the drain terminal of a transistor 204 of the pair (illustrated as transistor 104b in FIG. 1A). The second output lead frame 210 would also configured for connection to a power-driven device (e.g., illustrated as motor 120 in FIG. 1A) to supply current (e.g., illustrated as output 114 (current $i_b$) in FIG. 1A). A third output lead frame 210 would be connected to a third transistor pair, specifically to the source terminal of a transistor 202 of the pair (illustrated as transistor 102c in FIG. 1A) and to the drain terminal of a transistor 204 of the pair (illustrated as transistor 104c in FIG. 1A). The first output lead frame 210 would also configured for connection to a power-driven device (e.g., illustrated as motor 120 in FIG. 1A) to supply current (e.g., illustrated as output 116 (current $i_c$) in FIG. 1A).

As shown in FIG. 2B, the power transistor assembly 200 may further include insulating layers 220 (shown on top and bottom sides of the assembly). The insulating layers 220 may include a suitable insulating material (such as, e.g., resin), and may partially or fully encase the assembly 200. The first lead frame 206, the second lead frame 208, and the output lead frames 210 may provide a cooling effect by helping to dissipate heat generated by operation of the transistors in the power transistor assembly 200. Although not shown in FIGS. 2A-2B, the power transistor assembly 200 may further be configured to accommodate a gate driver circuit, one or more capacitors, and/or one or more cooling devices.

Figure 3:
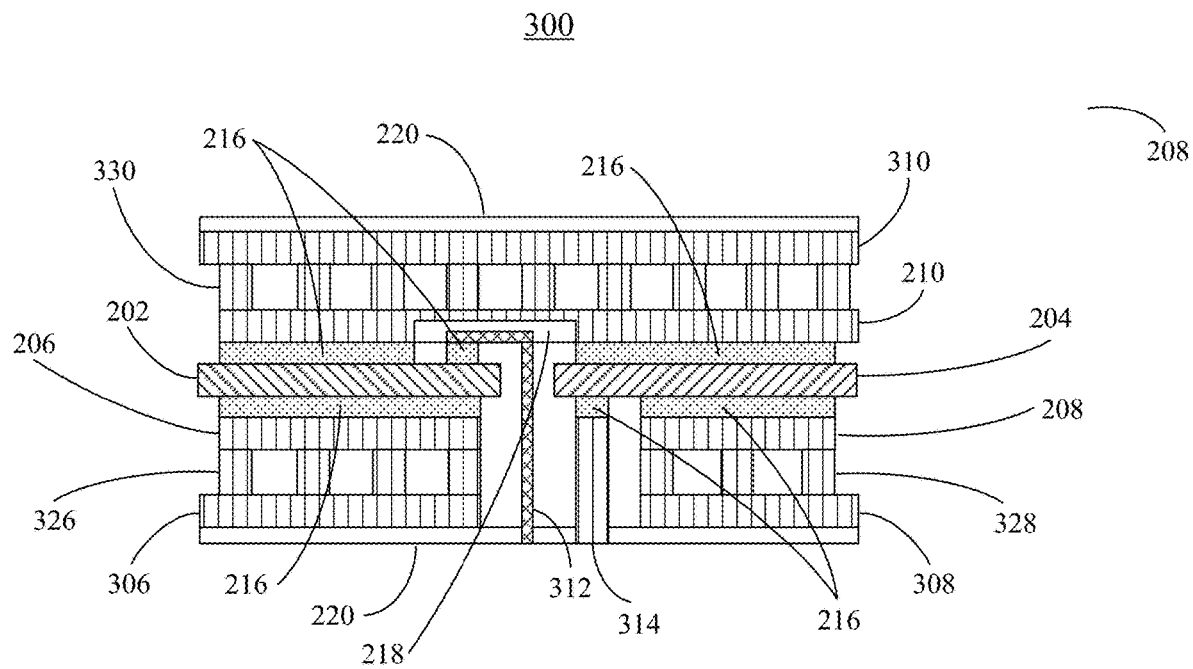
FIG. 3 is a diagram illustrating an example of a power transistor assembly according to one or more embodiments.

FIG. 3 is a diagram illustrating an example of a power transistor assembly 300 according to one or more embodiments, with reference to components and features described herein including but not limited to the figures and associated description. The power transistor assembly 300 may be configured for use in a power electronics assembly (such as described below with reference to FIG. 4 or FIG. 5). FIG. 3 illustrates a cross-sectional view of the power transistor assembly 300 (similar to the cross-sectional view for the power transistor assembly 200 shown in FIG. 2B). The power transistor assembly 300 includes many of the same components labeled and arranged as described above with reference to FIGS. 2A and 2B, the details of which will not be repeated here except as to describe additional details relating to the assembly 300. The power transistor assembly 300 may be suitable, e.g., when the assembly is encased or packaged within FR-4 insulation material (or an equivalent insulating material).

As shown in FIG. 3, the power transistor assembly 300 may include a first conducting layer 306, a second conducting layer 308, and a plurality of output conducting layers 310. The first conducting layer 306 provides a connection to the first lead frame 206 through one or more copper vias 326 formed through the insulating material. The second conducting layer 308 provides a connection to the second lead frame 208 through one or more copper vias 328 formed through the insulating material. Each of the output conducting layers 310 provides a connection to one of the output lead frames 210 through one or more copper vias 330 formed through the insulating material. Each of the first conducting layer 306, the second conducting layer 308, and the plurality of output conducting layers 310 may be constructed from a suitable conducting material (such as, e.g., copper or a copper alloy).

The power transistor assembly 300 may further be configured to accommodate signal terminal connections 312 for connecting to a signal terminal for each of the non-flipped transistors 202. As shown in FIG. 3, each of the transistors 202 is arranged such that the signal terminal faces upward in the direction toward the respective output lead frame 210. For each transistor 202, a conductor may be placed to provide an electrical coupling or connection 312 to the signal terminal, which may include, e.g., a copper via or other suitable conductor. As shown in FIG. 3, the copper via or other conductor may be arranged to provide a connection on an opposite side or surface of the transistor assembly 300 relative to the signal terminal of the respective transistor 202. A solder area 216 as shown may provide electric coupling between the signal terminal and the copper via or other conductor for connection to a signal (or gate) driver circuit (not shown). As shown in FIG. 3, to reduce or minimize the physical space occupied by the power transistor assembly 300, each of the output lead frames 210 may include a cutout area 218 surrounding the signal terminal 312. The cutout area 218 may be configured to accommodate the signal terminal 312 by allowing placement of the respective output lead frame 210 closer to the respective transistor pair while avoiding electrical contact between the respective output lead frame and the respective signal terminal 212. The space around the cutout area 218 may be fully or partially filled with a suitable insulating material (such as, e.g., FR-4). Likewise, other interior spaces or gaps in the power transistor assembly 300 may be fully or partially filled with a suitable insulating material (such as, e.g., FR-4).

The power transistor assembly 300 may further be configured to accommodate signal terminal connections 314 for each of the flipped transistors 204. As shown in FIG. 3, each of the transistors 204 is arranged such that the signal terminal faces downward in the direction away from the respective output lead frame 210. A conductor may be placed to provide an electrical coupling or connection 314 to the signal terminal, which may include, e.g., a copper via or other suitable conductor. A solder area 216 as shown may provide electric coupling between the signal terminal and the copper via or other conductor for connection to a gate driver circuit (not shown).

Figure 4:
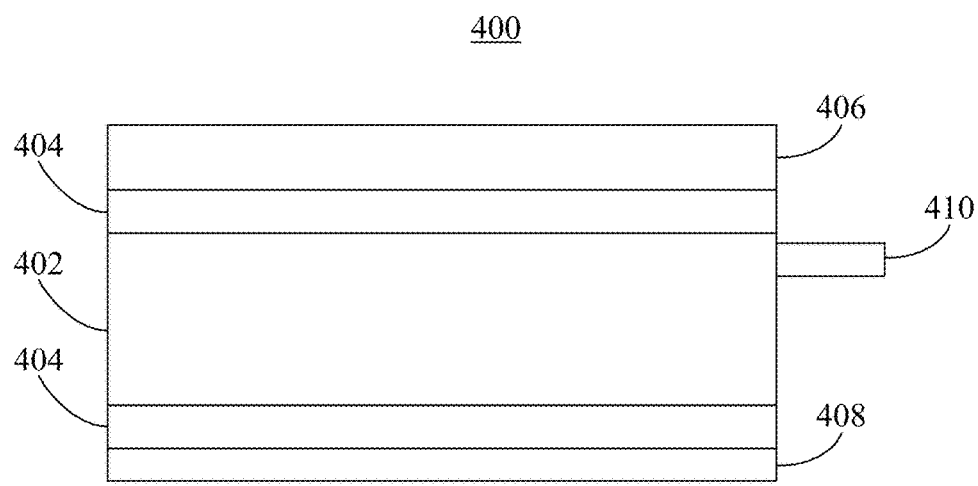
FIG. 4 is a diagram illustrating an example of a power electronics apparatus according to one or more embodiments.

FIG. 4 is a diagram illustrating an example of a power electronics apparatus 400 according to one or more embodiments, with reference to components and features described herein including but not limited to the figures and associated description. FIG. 4 illustrates a side view of the power electronics apparatus 400. The power electronics apparatus 400 may include one or more stacked components including a power transistor assembly 402. The power electronics apparatus 400 may also include one or more cooling assemblies 404, one or more capacitors 406 and/or a gate driver circuit 408. The power transistor assembly 402 may correspond to the power transistor assembly 200 (FIGS. 2A-2B), already discussed, or the power transistor assembly 300 (FIG. 3), already discussed. The power transistor assembly 402 may include a plurality of output lead frames 410. The output lead frames 410 may be the output lead frames 210 (FIGS. 2A-2B and FIG. 3), already discussed.

As shown in FIG. 4, the one or more cooling assemblies 404 may be arranged adjacent to and parallel to the power transistor assembly 402. Each cooling assembly 404 may include a cooling plate or other suitable device for cooling power electronic components, such as, for example, a double-sided cold plate with one side having two-phase cooling and the other side having single-phase cooling, or a double-sided cold plate with each side having two-phase cooling. In some embodiments, a double-sided cold plate may be arranged on each side of the power transistor assembly 402 such that the two-phase cooling sides of both cold plates are arranged adjacent to the power transistor assembly 402 while the single-phase cooling side is used to cool the capacitor and gate drive circuit, respectively.

As shown in FIG. 4, one or more capacitors 406 may be arranged parallel to the power transistor assembly 402. In some embodiments, a cooling assembly 404 may be arranged between the power transistor assembly 402 and the one or more capacitors 406.

Also as shown in FIG. 4, a gate driver circuit 408 may be arranged parallel to the power transistor assembly 402. The gate driver circuit 408 may provide input signals for the signal input (e.g., gate) terminal of one or more of the transistors in the power transistor assembly 402. A connection may be provided between each respective output driver signal of the gate driver circuit 408 and each respective signal terminal (e.g., through signal terminal connections 212-214 or 312-314 as described above with reference to FIGS. 2A-2B and 3) for the respective transistors in the power transistor assembly 402. The gate driver circuit 408 may selectively turn various ones of the transistors in the power transistor assembly 402 on or off so as to control the output current (or voltage) of the assembly.

In some embodiments, a cooling assembly 404 may be arranged between the power transistor assembly 402 and the gate driver circuit 408. In some embodiments, one or more capacitors 406 may be arranged parallel to and on an opposite side of the power transistor assembly 402 relative to the gate driver circuit 408. In some embodiments, a first cooling assembly 404 may be arranged between the power transistor assembly 402 and the gate driver circuit 408, and a second cooling assembly 404 may be arranged between the power transistor assembly 402 and the one or more capacitors 406.

Figure 5:
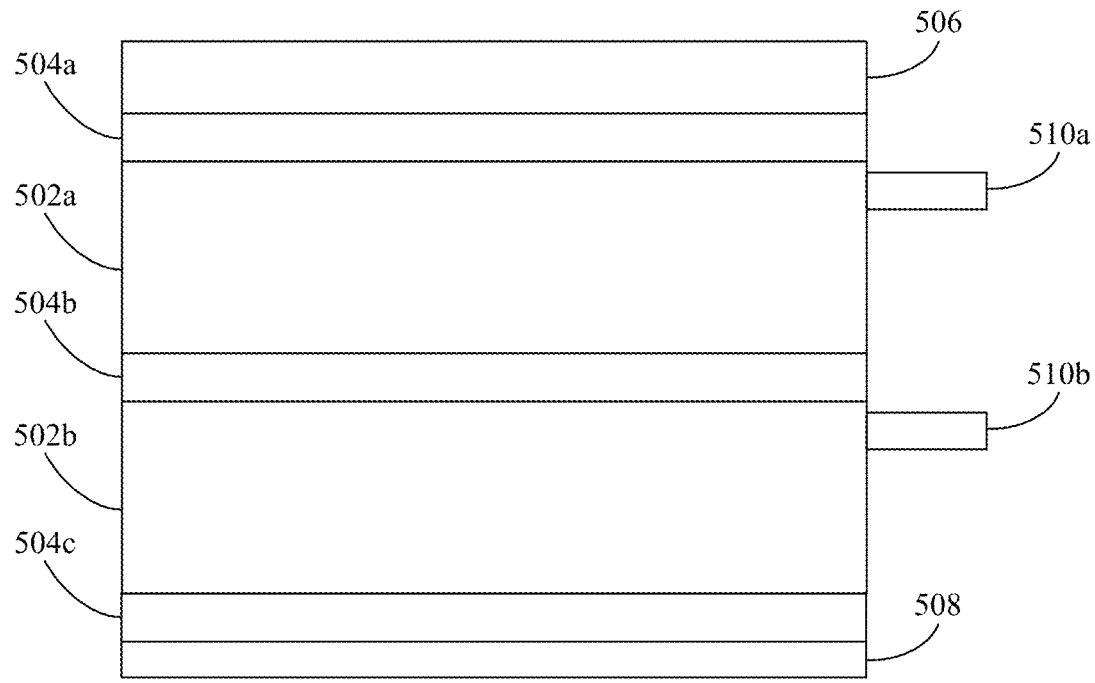
FIG. 5 is a diagram illustrating an example of a power electronics apparatus according to one or more embodiments.

FIG. 5 is a diagram illustrating an example of a power electronics apparatus 500 according to one or more embodiments, with reference to components and features described herein including but not limited to the figures and associated description. FIG. 5 illustrates a side view of the power electronics apparatus 500. The power electronics apparatus 500 may include a series of stacked components including a plurality of power transistor assemblies 502 (two such power transistor assemblies are shown as 502a and 502b). The power electronics apparatus 500 may also include one or more cooling assemblies 504 (three such cooling assemblies are shown as 504a, 504b and 504c), one or more capacitors 506 and/or a gate driver circuit 508. The power transistor assembly 502 may correspond to the power transistor assembly 200 (FIGS. 2A-2B), already discussed, or the power transistor assembly 300 (FIG. 3), already discussed. Each power transistor assembly 502 may include a plurality of output lead frames 510, such as 510a (part of power transistor assembly 502a) and 510b (part of power transistor assembly 502b). The output lead frames 510 may be the output lead frames 210 (FIGS. 2A-2B and FIG. 3), already discussed.

As shown in FIG. 5, the one or more cooling assemblies 504 may be arranged adjacent to and parallel to each power transistor assembly 502. Each cooling assembly 504 may include a cooling plate or other suitable device for cooling power electronic components, such as, for example, a double-sided cold plate with one side having two-phase cooling and the other side having single-phase cooling, or a double-sided cold plate with each side having two-phase cooling. In some embodiments, a pair of double-sided cold plate may be arranged (e.g., cooling assembly 504a and cooling assembly 504c) each on an outer side of a respective power transistor assembly 502 (e.g., 502a and 502b) such that the two-phase cooling sides of both cold plates are arranged adjacent to the respective power transistor assembly 502 while the single-phase cooling side is used to cool the one or more capacitors 506 and the gate drive circuit 508, respectively. In some embodiments, a double-sided cold plate with each side having two-phase cooling may be arranged (e.g., cooling assembly 504b) between each respective power transistor assembly 502 such that a respective two-phase cooling side of the cold plate is adjacent to a respective one of the power transistor assemblies 502.

As shown in FIG. 5, one or more capacitors 506 may be arranged parallel to the power transistor assembly 502a. In some embodiments, a cooling assembly 504a may be arranged between the power transistor assembly 502a and the one or more capacitors 506.

Also as shown in FIG. 5, a gate driver circuit 508 may be arranged parallel to the power transistor assembly 502b. The gate driver circuit 508 may provide input signals for the signal input (e.g., gate) terminal of one or more of the transistors in the power transistor assemblies 502a and 502b. A connection may be provided between each respective output driver signal of the gate driver circuit 508 and each respective signal terminal (e.g., through signal terminal connections 212-214 or 312-314 as described above with reference to FIGS. 2A-2B and 3) for the respective transistors in the power transistor assemblies 502a and 502b. The gate driver circuit 508 may selectively turn various ones of the transistors in the power transistor assemblies 502a and 502b on or off so as to control the output current (or voltage) of each assembly.

In some embodiments, a cooling assembly 504c may be arranged between the power transistor assembly 502b and the gate driver circuit 508. In some embodiments, one or more capacitors 506 may be arranged parallel to and on an opposite side of the power transistor assembly 502a relative to the gate driver circuit 508. In some embodiments, a cooling assembly 504c may be arranged between the power transistor assembly 502b and the gate driver circuit 508, a cooling assembly 504a may be arranged between the power transistor assembly 502a and the one or more capacitors 506, and a cooling assembly 504b may be arranged between the power transistor assembly 502a and the power transistor assembly 502b.

Figure 6:
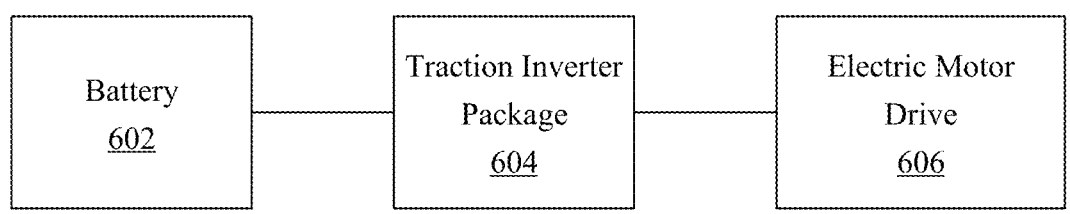
FIG. 6 is a block diagram of an example of a vehicle according to one or more embodiments.

FIG. 6 is a block diagram illustrating an example of a vehicle according to one or more embodiments, with reference to components and features described herein including but not limited to the figures and associated description. The vehicle 600 may include a battery 602, a traction inverter package 604, and an electric motor drive 606. The battery 602 may correspond to the voltage source 110 (FIG. 1A, already discussed). The traction inverter package 604 may include one or more of the power transistor assembly 200 (FIGS. 2A-2B, already discussed), the power transistor assembly 300 (FIG. 3, already discussed), the power electronics apparatus 400 (FIG. 4, already discussed) or the power electronics apparatus 500 (FIG. 5, already discussed). The traction inverter package 604 may be coupled to the battery 602 and the electric drive motor 606. The traction inverter package 604 may be configured to convert DC current from the battery 602 to AC current. The traction inverter package 604 may provide the AC current to the electric drive motor 606 to drive a propulsion system (not shown) of the vehicle 600. Moreover, the traction inverter package 604 may capture energy from a braking system (not shown) and feed the energy back to the battery 602. The traction inverter package 604 may implement an inverter circuit, such as the circuit 100 (FIG. 1A, already discussed). The electric drive motor 606 may correspond to the motor 120 (FIG. 1A, already discussed).

FIGS. 7A-7B provide flowcharts illustrating a method 700 of constructing a power electronics assembly according to one or more embodiments, with reference to components and features described herein including but not limited to the figures and associated description. The power electronics assembly as described may include the power electronics assembly 400 (FIG. 4, already discussed), or the power electronics assembly 500 (FIG. 5, already discussed).

Turning to FIG. 7A, construction of a transistor assembly for use in the power electronics assembly is described. The transistor assembly may include the power transistor assembly 200 (FIGS. 2A-2B, already discussed), or the power transistor assembly 300 (FIG. 3, already discussed). At block 710, a plurality of transistor pairs may be arranged in a common plane. Each transistor pair comprises a first transistor and a second transistor, where each transistor comprises a first terminal and a signal terminal on a first surface and a second terminal on a second surface, the second surface on an opposite side relative to the first surface. For each pair of transistors the second transistor is flipped relative to the first transistor such that the second surface of the second transistor faces the same direction as the first surface of the first transistor.

At block 720, a first lead frame may be arranged parallel to the first transistor in each transistor pair, where the first lead frame is electrically coupled to the first transistor in each transistor pair. In some embodiments, the first lead frame may be electrically coupled to the second terminal of the first transistor in each transistor pair.

At block 730, a second lead frame may be arranged coplanar to the first lead frame and parallel to the second transistor in each transistor pair, where the second lead frame is electrically coupled to the second transistor in each transistor pair. In some embodiments, the second lead frame may be electrically coupled to the first terminal of the second transistor in each transistor pair.

At block 740, a plurality of output lead frames may be arranged coplanar to each other, where each respective output lead frame is arranged parallel to and electrically coupled to a respective one pair of the plurality of transistor pairs. In some embodiments, for each transistor pair, the respective output lead frame may be electrically coupled to the first terminal of the first transistor and to the second terminal of the second transistor in the respective transistor pair.

Turning now to FIG. 7B, at block 760, a gate driver circuit may be arranged parallel to the transistor assembly and electrically coupled to the signal terminal of at least one of the transistors. At block 770, a capacitor may be arranged parallel to the transistor assembly and on an opposite side of the transistor assembly relative to the gate driver circuit. At block 780, a first cooling assembly may be arranged parallel to the transistor assembly and situated between the transistor assembly and the gate driver circuit, and a second cooling assembly may be arranged parallel to the transistor assembly and situated between the transistor assembly and the capacitor. In some embodiments, the gate driver circuit may be electrically coupled to the signal terminal of each of the transistors, the plurality of transistor pairs may be equal to three transistor pairs, and the gate driver circuit may be configured to provide input signals to the transistor assembly sufficient to cause the transistor assembly to produce a three-phase output to drive a motor.

The above described methods and systems may be readily combined together if desired. The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

Those skilled in the art will appreciate from the foregoing description that the broad techniques of the embodiments of the present disclosure can be implemented in a variety of forms. Therefore, while the embodiments of this disclosure have been described in connection with particular examples thereof, the true scope of the embodiments of the disclosure should not be so limited since other modifications will become apparent to the skilled practitioner upon a study of the drawings, specification, and following claims.

We claim:

1. A power electronics apparatus comprising:
   a transistor assembly comprising a plurality of transistor pairs arranged in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor;

wherein, the transistor assembly further comprises:
a first lead frame arranged parallel to the first transistor in each transistor pair, the first lead frame electrically coupled to the first transistor in each transistor pair;
a second lead frame arranged coplanar to the first lead frame and parallel to the second transistor in each transistor pair, the second lead frame electrically coupled to the second transistor in each transistor pair; and
a plurality of output lead frames arranged coplanar to each other, each respective output lead frame arranged parallel to and electrically coupled to a respective one pair of the plurality of transistor pairs.

2. The apparatus of claim 1, wherein each respective output lead frame has an opening to accommodate a respective one of the signal terminals while avoiding electrical contact between the respective output lead frame and the respective one of the signal terminals.

3. The apparatus of claim 1, further comprising a cooling assembly arranged parallel to the transistor assembly.

4. The apparatus of claim 1, further comprising a gate driver circuit arranged parallel to the transistor assembly and electrically coupled to the signal terminal of at least one of the transistors.

5. The apparatus of claim 4, further comprising a capacitor arranged parallel to the transistor assembly.

6. The apparatus of claim 5, wherein the capacitor is arranged on an opposite side of the transistor assembly relative to the gate driver circuit, and further comprising:
a first cooling assembly arranged parallel to the transistor assembly and situated between the transistor assembly and the gate driver circuit; and
a second cooling assembly arranged parallel to the transistor assembly and situated between the transistor assembly and the capacitor.

7. The apparatus of claim 1, wherein the first lead frame is electrically coupled to the second terminal of the first transistor in each transistor pair, wherein the second lead frame is electrically coupled to the first terminal of the second transistor in each transistor pair, and wherein for each transistor pair, the respective output lead frame is electrically coupled to the first terminal of the first transistor and to the second terminal of the second transistor in the respective transistor pair.

8. The apparatus of claim 7, further comprising a gate driver circuit arranged parallel to the transistor assembly and electrically coupled to the signal terminal of each of the transistors, wherein the plurality of transistor pairs is equal to three transistor pairs, and wherein the gate driver circuit is configured to provide input signals to the transistor assembly sufficient to cause the transistor assembly to produce a three-phase output to drive a motor.

9. The apparatus of claim 1, wherein each of the transistors is a metal oxide semiconductor field effect transistor (MOSFET).

10. A method of constructing a power electronics apparatus comprising:
constructing a transistor assembly comprising:
arranging a plurality of transistor pairs in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor;
arranging a first lead frame parallel to the first transistor in each transistor pair, the first lead frame electrically coupled to the first transistor in each transistor pair;
arranging a second lead frame coplanar to the first lead frame and parallel to the second transistor in each transistor pair, the second lead frame electrically coupled to the second transistor in each transistor pair; and
arranging a plurality of output lead frames coplanar to each other, each respective output lead frame arranged parallel to and electrically coupled to a respective one pair of the plurality of transistor pairs.

11. The method of claim 10, wherein each respective output lead frame has an opening to accommodate a respective one of the signal terminals while avoiding electrical contact between the respective output lead frame and the respective one of the signal terminals.

12. The method of claim 10, further comprising arranging a cooling assembly parallel to the transistor assembly.

13. The method of claim 10, further comprising arranging a gate driver circuit parallel to the transistor assembly and electrically coupled to the signal terminal of at least one of the transistors.

14. The method of claim 13, further comprising arranging a capacitor parallel to the transistor assembly.

15. The method of claim 14, wherein the capacitor is arranged on an opposite side of the transistor assembly relative to the gate driver circuit, and further comprising:
arranging a first cooling assembly parallel to the transistor assembly and situated between the transistor assembly and the gate driver circuit; and
arranging a second cooling assembly parallel to the transistor assembly and situated between the transistor assembly and the capacitor.

16. The method of claim 10, wherein the first lead frame is electrically coupled to the second terminal of the first transistor in each transistor pair, wherein the second lead frame is electrically coupled to the first terminal of the second transistor in each transistor pair, and wherein for each transistor pair, the respective output lead frame is electrically coupled to the first terminal of the first transistor and to the second terminal of the second transistor in the respective transistor pair.

17. The method of claim 16, further comprising arranging a gate driver circuit parallel to the transistor assembly and electrically coupled to the signal terminal of each of the transistors, wherein the plurality of transistor pairs is equal to three transistor pairs, and wherein the gate driver circuit is configured to provide input signals to the transistor assembly sufficient to cause the transistor assembly to produce a three-phase output to drive a motor.

18. The method of claim 10, wherein each of the transistors is a metal oxide semiconductor field effect transistor (MOSFET).

19. A power electronics apparatus comprising:
a plurality of transistor assemblies arranged in a stack, each transistor assembly parallel to the other transistor assemblies in the stack, wherein each transistor assembly comprises:
a plurality of transistor pairs arranged in a common plane, each transistor pair comprising a first transistor and a second transistor, each transistor comprising a first terminal and a signal terminal on a first surface and a second terminal on a second surface, the second surface on an opposite side relative to the first surface, wherein for each pair of transistors the second transistor is flipped relative to the first transistor such that the second surface of the second transistor faces the same direction as the first surface of the first transistor;

a first lead frame arranged parallel to the first transistor in each transistor pair, the first lead frame electrically coupled to the first transistor in each transistor pair;

a second lead frame arranged coplanar to the first lead frame and parallel to the second transistor in each transistor pair, the second lead frame electrically coupled to the second transistor in each transistor pair; and a plurality of output lead frames arranged coplanar to each other, each respective output lead frame arranged parallel to and electrically coupled to a respective one pair of the plurality of transistor pairs.

20. The apparatus of claim 19, further comprising:

a plurality of cooling assemblies, each cooling assembly arranged parallel to and situated adjacent to one of the transistor assemblies;

a gate driver circuit arranged parallel to one of the transistor assemblies and electrically coupled to the signal terminal of at least one of the transistors; and a capacitor arranged parallel to one of the transistor assemblies, wherein each of the plurality of output lead frames has an opening to accommodate one of the signal terminals.

\* \* \* \* \*